United States Patent [19]

Lendaro

[11] Patent Number: 5,121,076
[45] Date of Patent: Jun. 9, 1992

[54] PLURAL TIME CONSTANT SIGNAL CONTROL

[75] Inventor: Jeffery B. Lendaro, Noblesville, Ind.

[73] Assignee: Thomson Consumer Electronics, Inc., Indianapolis, Ind.

[21] Appl. No.: 696,490

[22] Filed: May 6, 1991

[51] Int. Cl.⁵ .............................................. H03G 3/20
[52] U.S. Cl. .................................. 330/141; 330/281; 381/107
[58] Field of Search ................... 330/141, 280, 281; 358/198; 381/104, 105, 107, 109; 455/194

[56] References Cited

U.S. PATENT DOCUMENTS

| | | | |
|---|---|---|---|
| 3,828,267 | 8/1974 | Tsurvshima | 330/281 X |
| 3,961,281 | 6/1976 | Woolling, Jr. | 330/129 |
| 4,405,948 | 9/1983 | Griffis | 358/198 |
| 4,633,518 | 12/1986 | Kennedy et al. | 330/281 X |
| 4,641,190 | 2/1987 | Testin et al. | 455/194 X |
| 4,792,990 | 12/1988 | Beyers, Jr. | 381/107 X |

OTHER PUBLICATIONS

Schematic and analysis of a portion of the circuitry of a model CMT 2542 television receiver made by the Goldstar Company of South Korea.

*Primary Examiner*—Steven Mottola
*Attorney, Agent, or Firm*—Joseph S. Tripoli; Peter M. Emanuel; Frederick A. Wein

[57] ABSTRACT

The present invention concerns apparatus having a voltage controlled amplifier wherein the gain of the amplifier is determined in response to the level of a control signal at an input terminal. A first rate of change is used for a change of gain from a low signal level to a higher signal level, and a second rate of change is used for a change from a high signal level to a lower signal level with the second rate being faster than the first rate.

5 Claims, 1 Drawing Sheet

PLURAL TIME CONSTANT SIGNAL CONTROL

BACKGROUND

The present invention relates to television receivers, and more particularly, to the processing of signals receiver by television or FM receiver, with particular application to audio signals.

For a more pleasing sound from a television receiver, it may be desirable to cause the level of a signal to increase slowly but still to have a quick decrease in level under some circumstances. This type of different rate signal change can be desirable during a power-up operation, following a channel change, or following a customer un-mute from a remote control so that a slow rise time takes the edge off the signal "attack". This is especially desirable when there is a channel change with the new channel having a loud audio level. However, on a user mute when going into a channel change and just before set turn-off, the user expects a quick reduction of audio level and may be disturbed if the lowering of the signal level takes too long. Accordingly, it is recognized herein that a signal control having a slow rate of change for increasing signals and a faster rate of change for decreasing signals is desirable for achieving these results.

As used herein the term "signal" can be an audio signal, video composite signal, luminance signal, chroma signal, etc. even though the exemplary embodiment particularly discusses an audio signal.

SUMMARY OF THE INVENTION

The present invention concerns apparatus having a voltage controlled amplifier wherein the gain of the amplifier is determined in response to the level of a control signal at an input terminal. A first rate of change is used for a change of gain from a low signal level to a higher signal level, and a second rate of change is used for a change from a high signal level to a lower signal level with the second rate being faster than the first rate.

DETAILED DESCRIPTION OF THE PREFERRED EMBODIMENT

Figure 1:
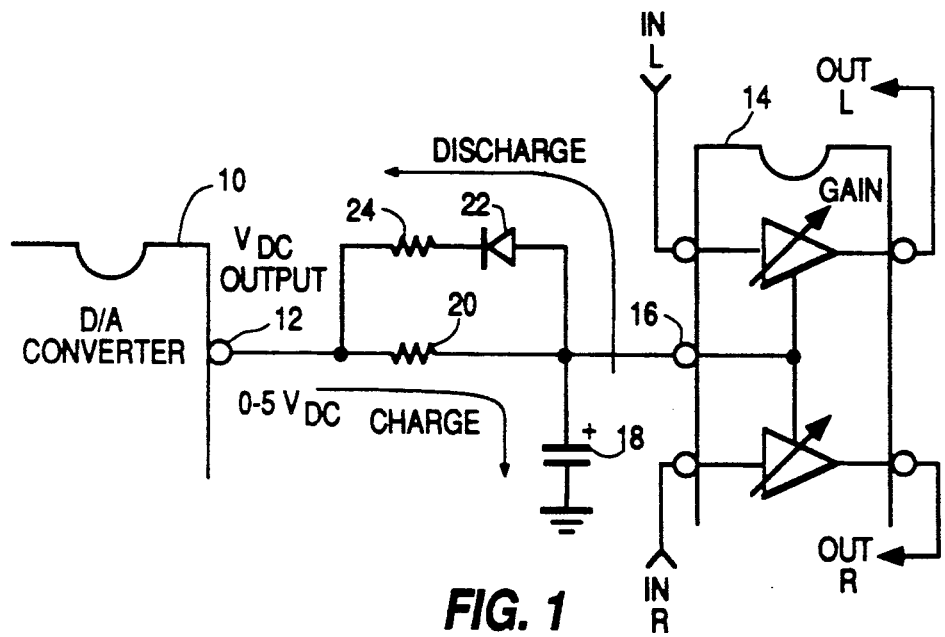
FIG. 1 shows part block diagram and part schematic representation of the circuit according to aspects of the present invention.

Referring now to FIG. 1, there is shown a digital to analog converter (DAC) 10 providing an analog audio level control signal at terminal 12. In the exemplary embodiment, the audio control signal is derived from the microprocessor control IC in response to signals received from a remote control. The audio signal can be derived from a television source, FM source, CD disk player, or the like (not shown). If derived from a television source such as a broadcast station, satellite source, or cable television source, the audio signal is part of a composite signal which is detected in the usual way for providing a sound IF signal which is then detected to provide the audio signal. The derived audio signal is coupled to a gain controlled amplifier 14 for processing of the derived audio signal with the gain controlled by the control signal at the output pin 12 of DAC 10. Thus, the output signal at pin 12 is not the audio signal itself but the control signal for determining the level of the audio signal which is subsequently coupled to power amplifiers and loudspeakers (not shown).

As explained above, it is desirable from a user satisfaction point of view, that the rates of change for the audio sound be different when changing from a lower level to a higher level of sound than when changing from a higher level of sound to a lower level. The gain of gain controlled amplifier 14 is adjustable in response to a control signal applied to pin 16. The volume level control signal at pin 12 is coupled to capacitor 18 through resistor 20 for establishing a first time constant with the voltage across capacitor 18 and at terminal 16 increasing at a first rate. For lowering the volume level, the discharge of capacitor 18 and the change of voltage at pin 16 is accomplished by discharge of capacitor 18 through diode 22 through the impedance present at terminal 12, which could be the output impedance of DAC 10 at terminal 12 and/or which external resistor coupled between terminal 12 and ground (not shown). Thus, upon a decrease in sound level, the voltage across capacitor 18 and at terminal 16 is changed at a second rate which is faster than the first rate. If the second rate is deemed to be too fast, it can be adjusted by coupling a resistor 24 in series with diode 22 for slowing the second rate while still keeping the second rate faster than the first rate of change.

Figure 2:
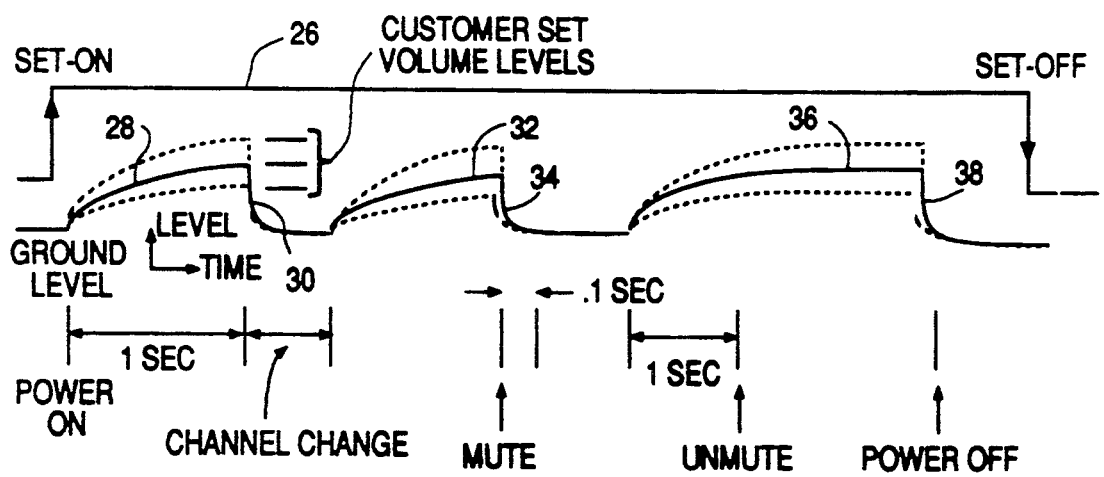
FIG. 2 shows a graphic representation of a representative timing curves applicable when using aspects of the present invention shown in FIG. 1.

As applied to an audio system, reference can be had to the timing and level diagrams of FIG. 2 where it is shown that it is desirable to have a rapid decrease in sound level when certain operational changes are accomplished in the signal receiver. For example upon set power-on shown by diagram 26, the sound level is increased, as shown by curve 28, to one of various levels which were previously set by the user. Upon initiation of a change of channel, it may be desirable that the sound be rapidly decreased as shown by curve 30 thus effectively muting the sound during the change of channel. Once the channel has been selected, the sound will again be increased to a level as shown by curve 32. If a mute is initiated from a remote control or the like, the sound is rapidly lowered as shown by curve 34 and kept at that "off" level until the sound is un-muted wherein the sound increases in level as shown in curve 36 to the previous level. Upon the set being shut-off as shown by diagram 26, the sound is rapidly lowered as shown by curve 38 so that disruptions of operational status within the set during power-down do not cause audio transients which would be audible to the user.

What is claimed is:

1. Apparatus for controlling signal level comprising:
    a voltage controlled amplifier wherein the gain of the amplifier is determined in response to the level of a control signal at an input terminal,
    control means for generating said control signal,
    first time constant means coupled to said control means for causing said control signal to change form a low level of gain to a higher level at a first rate of change, and
    second time constant means coupled to said control means for causing said control signal to change from the higher level of gain to a lower level at a second rate of change,
    the second rate of change being faster than the first rate of change.

2. The apparatus of claim 1 wherein the first time constant means comprises a first resistor and a capacitor and the second time constant means comprises the capacitor and a diode shunting the first resistor.

3. The apparatus of claim 2 wherein the second time constant further comprises a resistor in series with the diode, said second resistor having a resistance value less than the first resistor.

4. Apparatus for controlling audio volume comprising:
   a voltage controlled amplifier for amplifying an audio signal wherein the gain of the amplifier is determined in response to the level of a control signal at an input terminal,
   control means for generating said control signal,
   first time constant means coupled to said control means for causing said control signal to change from a low level of volume to a higher level at a first rate of change, and
   second time constant means coupled to said control means for causing said control signal to change from the higher level of volume to a lower level at a second rate of change,
   the second rate of change being faster than the first rate of change.

5. Apparatus for muting audio volume comprising:
   a voltage controlled amplifier for amplifying an audio signal wherein the gain of the amplifier is determined in response to the level of a control signal at an input terminal,
   control means for generating said control signal,
   first time constant means coupled to said control means for causing said control signal to change form a low level of volume to a higher level at a first rate of change, and
   second time constant means coupled to said control means for causing said control signal to change from the higher level of volume to a lower level at a second rate of change,
   the second rate of change being faster than the first rate of change for muting the volume of the audio signal in response to a change of operational status of the apparatus.

* * * * *